United States Patent [19]
Matsuno

[11] Patent Number: 6,163,221
[45] Date of Patent: Dec. 19, 2000

[54] HIGH-FREQUENCY AMPLIFICATION DEVICE

[75] Inventor: Noriaki Matsuno, Tokyo, Japan

[73] Assignee: NEC Corporation, Tokyo, Japan

[21] Appl. No.: 09/298,602

[22] Filed: Apr. 23, 1999

[30] Foreign Application Priority Data

Apr. 24, 1998 [JP] Japan .................................. 10-115769

[51] Int. Cl.[7] ...................................................... H03F 3/04
[52] U.S. Cl. .......................................... 330/302; 330/306
[58] Field of Search .................................. 330/277, 286, 330/302, 306, 307

[56] References Cited

U.S. PATENT DOCUMENTS

| | | | |
|---|---|---|---|
| 4,841,253 | 6/1989 | Crabill | 330/277 |
| 4,864,250 | 9/1989 | Bacon | 330/277 |
| 5,642,080 | 6/1997 | Whang et al. | 330/277 |

*Primary Examiner*—Robert Pascal
*Assistant Examiner*—Henry Choe
*Attorney, Agent, or Firm*—Ostrolenk, Faber, Gerb & Soffen, LLP

[57] ABSTRACT

A high-frequency amplification device having an active element and a matching circuit and a bias supplying circuit for the active element, wherein the active element has such a small resistance component of input impedance that gives a stability factor k of less than 1 for the active element itself at a frequency band that the high-frequency amplification device is used, and a loss of the matching circuit or bias supplying circuit or a loss of the matching circuit and bias supplying circuit is used to give a stability factor k of greater than 1 for the high-frequency amplification device.

14 Claims, 13 Drawing Sheets

HIGH-FREQUENCY AMPLIFICATION DEVICE

FIELD OF THE INVENTION

This invention relates to an amplification device used at a high frequency.

BACKGROUND OF THE INVENTION

An example of composition of a conventional 900 MHz-band amplifier for portable telephone that uses a source-grounded MOSFET is shown in FIG.1. The conventional amplifier is composed of MOSFET 1 with a stability factor k of greater than 1 for the device itself in a bandwidth that the amplifier is used, and a matching circuit 2 and a bias supplying circuit 6 and a matching circuit 3 and a bias supplying circuit 7 that are connected to the gate and drain, respectively, of MOSFET 1.

In this composition, when the matching circuits 2, 3 and the gate bias supplying circuit 6 have no loss in high-frequency use, and when the drain bias supplying circuit 7 has no loss to both direct-current and high-frequency, the performance of the amplification device becomes maximum. When the matching circuits 2, 3 or the bias supplying circuits 6, 7 have a loss, the performance of the amplification device reduces with that loss.

Also, when the amplification device in FIG. 1 is MMIC-structured, since all or part of the matching circuits 2, 3 and bias supplying circuits 6, 7 are formed on silicon substrate, the loss increases and it is therefore difficult to enhance its performance.

For the purpose of preventing deterioration in performance due to the loss of matching circuit, it is necessary to use a passive element with a reduced loss as the matching circuit. Further, in order to reduce the loss of a passive element, especially an inductor, it is generally necessary to increase the film thickness of wiring metal or increase the wiring width. To increase the film thickness of wiring metal needs a particular process for making such a thick wiring or takes a very long time for making it. Therefore, the manufacturing cost increases. On the other hand, when the wiring width is increased, especially for a spiral inductor, the size increases outstandingly because the certain number of turns is required to get a necessary inductance. Therefore, the manufacturing cost increases as well. Also, in order to reduce the loss of a capacitor, it is necessary to use a low-resistance material for the electrode. Therefore, the number of process increases.

When a capacitor is formed on a silicon substrate, since the lower electrode of the capacitor and the silicon substrate are in capacitive coupling, a loss due to the resistance of the silicon substrate occurs. In order to prevent this, high-permittivity film or dielectric thin film is needed. Therefore, the manufacturing cost increases as well.

FIG. 2 shows an example of composition of a conventional MMIC amplification device composed of GaAsFET. Also in this device, in order to reduce sufficiently the loss of matching circuit and bias supplying circuit, it is necessary to increase the wiring width of spiral inductors 12, 13 and 15 or to increase the film thickness of wiring metal thereof. In the former solution, the chip cost of MMIC increases, thereby the manufacturing cost increases. The latter solution needs a particular process for making such a thick wiring or takes a very long time for making it. Therefore, the manufacturing cost increases as well.

In the conventional devices, as described above, for the purpose of preventing deterioration in performance due to the loss of matching circuit and bias supplying circuit, it is necessary to increase the film thickness of wiring metal used for matching circuit, to increase the wiring width, or to use high-permittivity film or dielectric thin film for capacitor. Therefore, the manufacturing cost increases.

SUMMARY OF THE INVENTION

Accordingly, it is an object of the invention to provide a high-frequency amplification device that is provided with a matching circuit and a bias supplying circuit with a reduced size and can conduct a stable amplification operation.

It is a further object of the invention to provide a high-frequency amplification device that incurs no increase in manufacturing cost of passive circuit used for matching circuit and bias supplying circuit and can prevent a reduction in performance due to a loss of matching circuit and bias supplying circuit as well as utilizing maximumly the performance of the device.

According to the invention, a high-frequency amplification device, comprises:

an active element; and a matching circuit for the active element;

wherein the active element has such a small resistance component of input impedance that gives a stability factor k of less than 1 for the active element itself at a frequency band that the high-frequency amplification device is used, and a loss of the matching circuit is used to give a stability factor k of greater than 1 for the high-frequency amplification device.

According to another aspect of the invention, a high-frequency amplification device, comprises:

an active element; and a bias supplying circuit for the active element;

wherein the active element has such a small resistance component of input impedance that gives a stability factor k of less than 1 for the active element itself at a frequency band that the high-frequency amplification device is used, and a loss of the bias supplying circuit is used to give a stability factor k of greater than 1 for the high-frequency amplification device.

According to another aspect of the invention, a high-frequency amplification device, comprises:

an active element; and a matching circuit and a bias supplying circuit for the active element;

wherein the active element has such a small resistance component of input impedance that gives a stability factor k of less than 1 for the active element itself at a frequency band that the high-frequency amplification device is used, and a loss of the matching circuit and the bias supplying circuit is used to give a stability factor k of greater than 1 for the high-frequency amplification device.

BRIEF DESCRIPTION OF THE DRAWINGS

The invention will be explained in more detail in conjunction with the appended drawings, wherein.

DESCRIPTION OF THE PREFERRED EMBODIMENTS

The various embodiments of a high-frequency amplification device according to the invention will be explained below.

Figure 1:
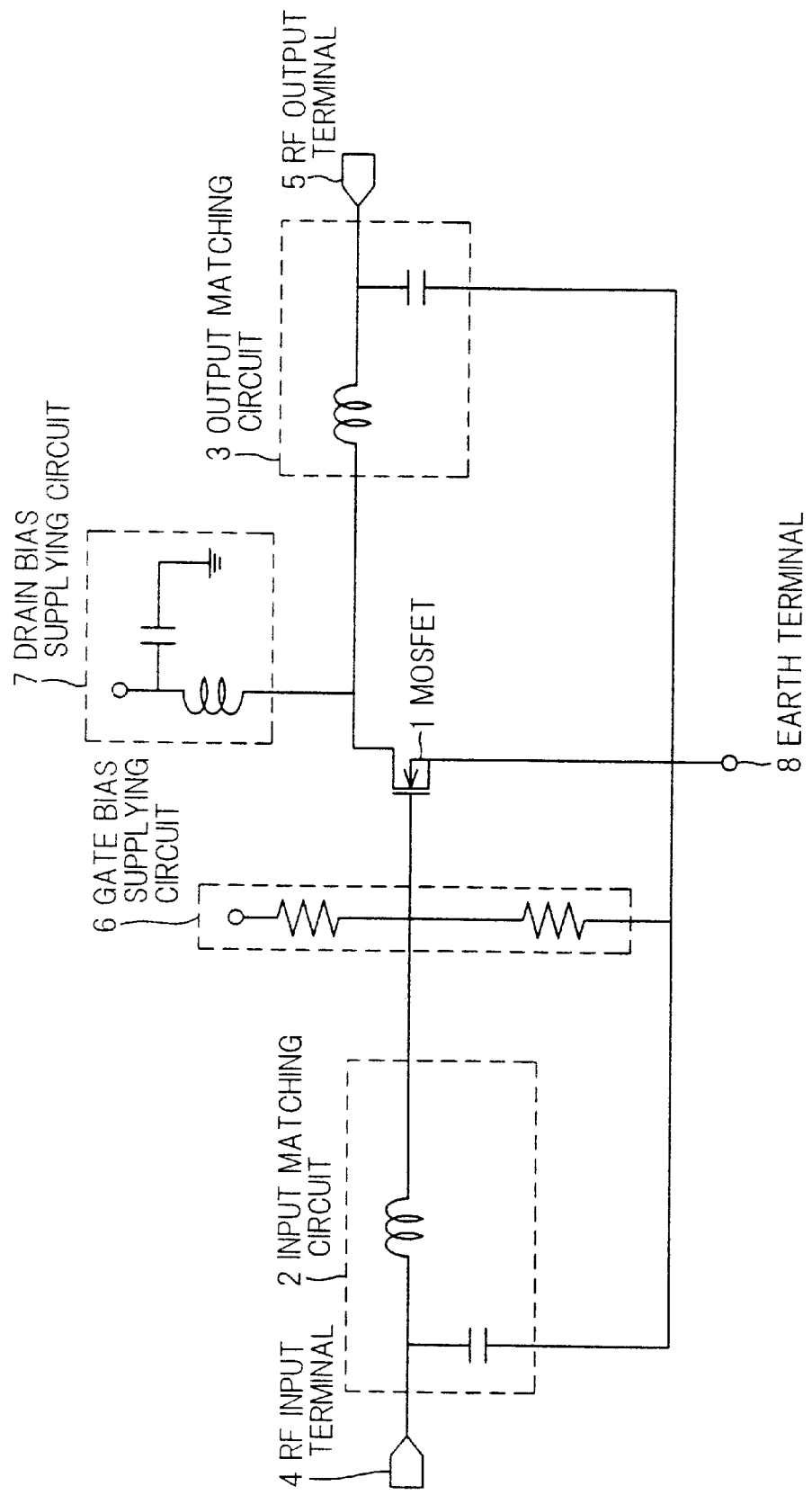
FIG. 1 is a circuit diagram showing a conventional amplification circuit.
Figure 2:
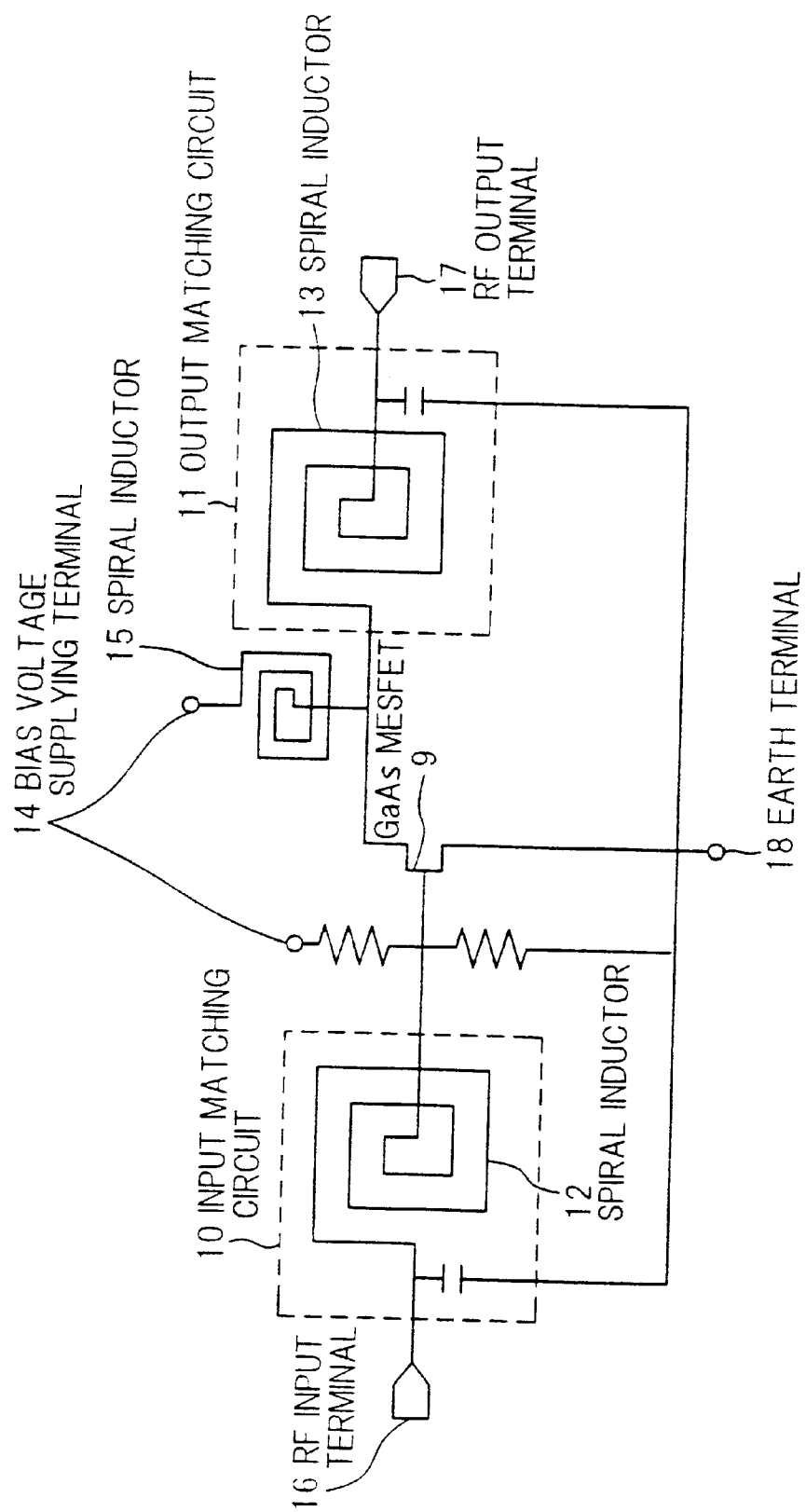
FIG. 2 is a circuit diagram showing another conventional amplification circuit.
Figure 3:
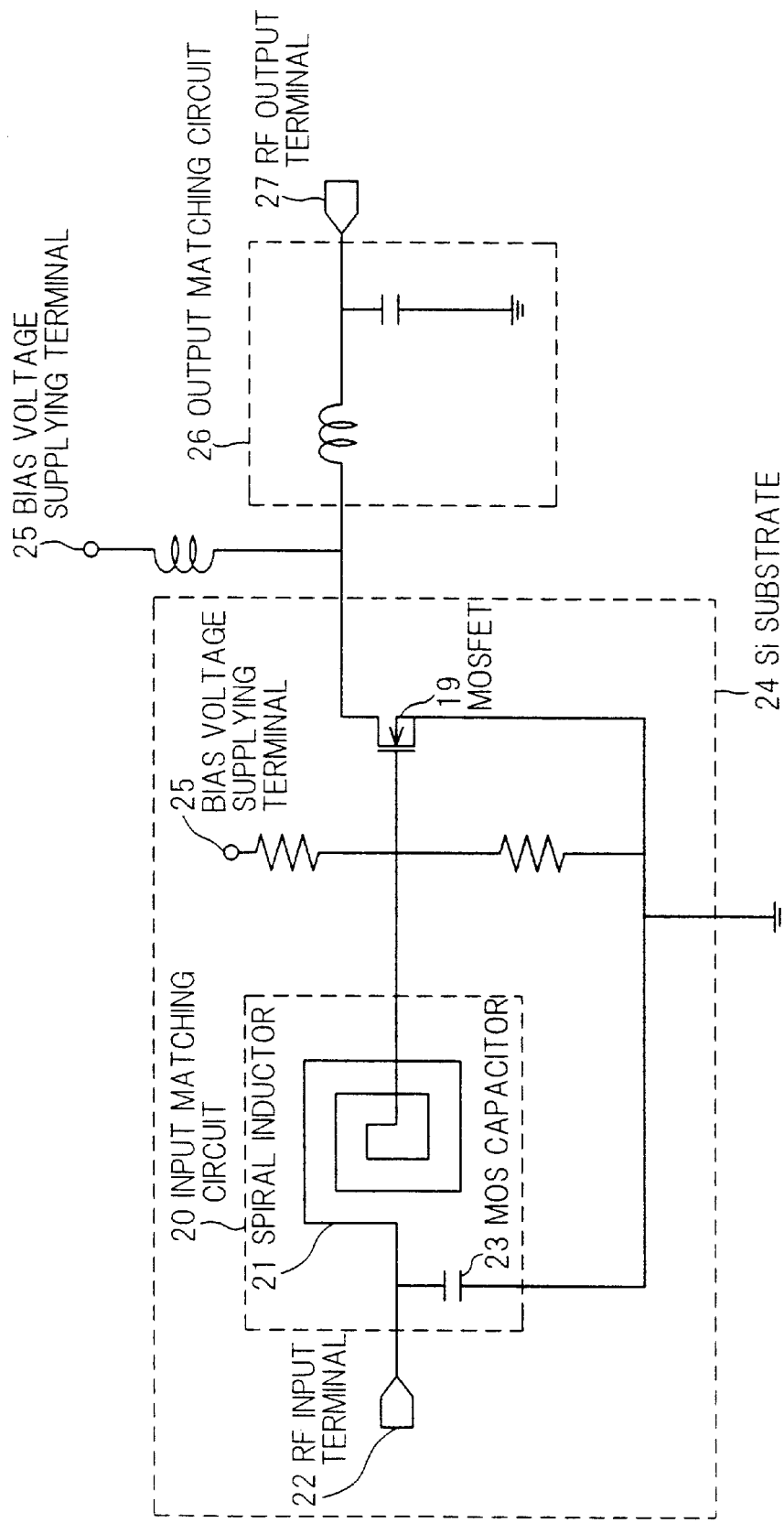
FIG. 3 is a circuit diagram showing a high-frequency amplification device in a first preferred embodiment according to the invention.

FIG. 3 shows a high-frequency amplification device in the first preferred embodiment according to the invention. This embodiment is an example of a 900 MHz-band high-frequency amplification device, in which silicon-MOSFET (MOSFET 19) is used as an amplification element and an input matching circuit 20 is formed on a silicon substrate 22 where MOSFET 19 is formed. The input matching circuit 20 is composed of a spiral inductor 21 and a MOS capacitor 23. The loss of the amplification device generates mainly from the spiral inductor.

MOSFET 19 used in this amplification device has a stability factor k of less than 1 for the device itself at 900 MHz. When it is connected with a loss-free matching circuit, it comes into such an instable operation state that the input/output reflection coefficient exceeds 1 or it oscillates.

Figure 4:
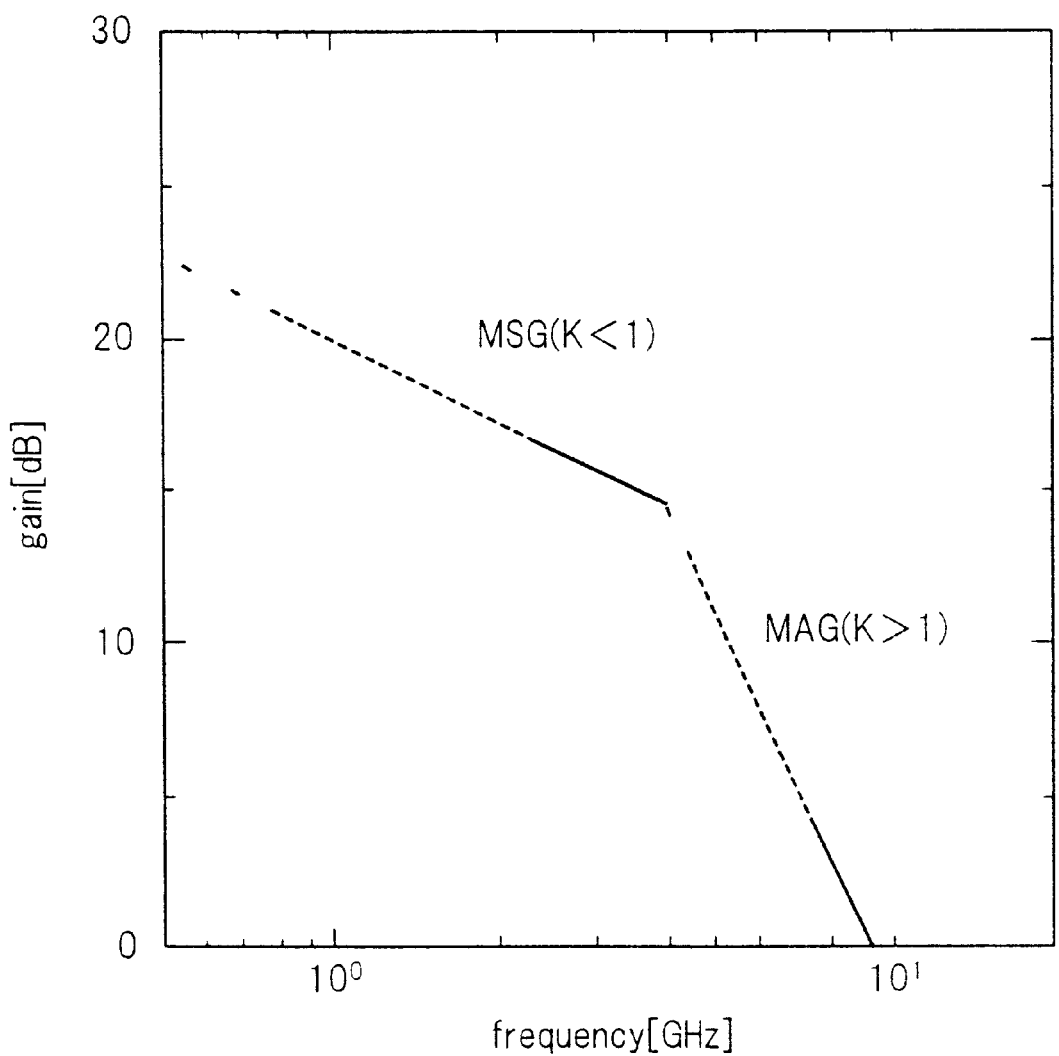
FIG. 4 is a characteristic diagram showing MSG/MAG of an amplification element MOSFET itself.

FIG. 4 shows MSG (maximum stable gain)/MAG (maximum available gain) obtained from the measurement results of s parameter of MOSFET 19 itself used in this amplification device. A gain at 900 MHz falls within the MSG region. Therefore, when obtaining aMSB value greater than 20 dB by MOSFET 19, it is understood that the amplifier becomes instable. So, in order to get a practically sufficiently stable amplifier using MOSFET 19, it is necessary to control the gain of the amplifier to be about 3 dB less than MSB, i.e., about 17 dB.

The spiral inductor 21 used in the amplification circuit in FIG. 3 is formed on the silicon substrate and does not use particularly thick wiring metal that reduces the loss. Therefore, it has a large loss. So, the input matching circuit 20 used in the amplification circuit in FIG. 3 has a large loss, which is, in this example, an insertion loss of about 6 dB.

Thus, in the amplification circuit in FIG. 3, MOSFET 19 with a stability factor k of less than 1 for the device itself at 900 MHz band is connected with the input matching circuit 20 with an insertion loss of about 6 dB. Due to the loss of the input matching circuit 20, the gain is reduced and the stability factor k of the amplification device becomes greater than 1.

Figure 5:
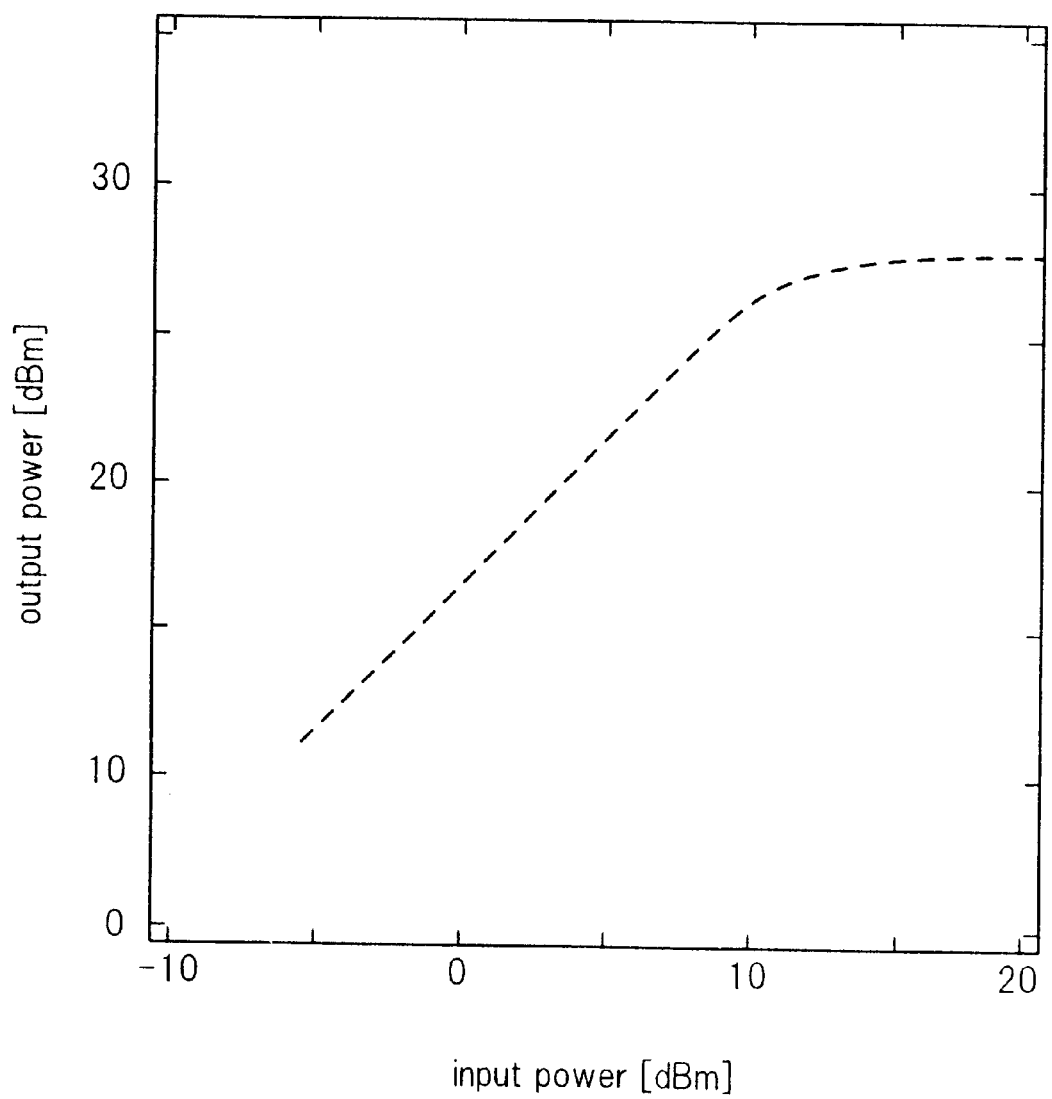
FIG. 5 is a characteristic diagram showing input/output power of the amplification device in FIG. 3.

FIG. 5 shows the input-output electric power characteristic of this amplification device. It is proved that a gain of about 17 dB is obtained in this amplification device. In this case, the input reflection coefficient and output reflection coefficient are −6 dB and −5 dB, respectively, which shows that a sufficiently stable operation is conducted. Namely, though the matching circuit 20 with such a large loss as 6 dB is used, since it is used as the loss to stabilize the operation of MOSFET, a maximum gain that can be obtained practically by MOSFET 19, about 17 dB, is available.

Figure 6:
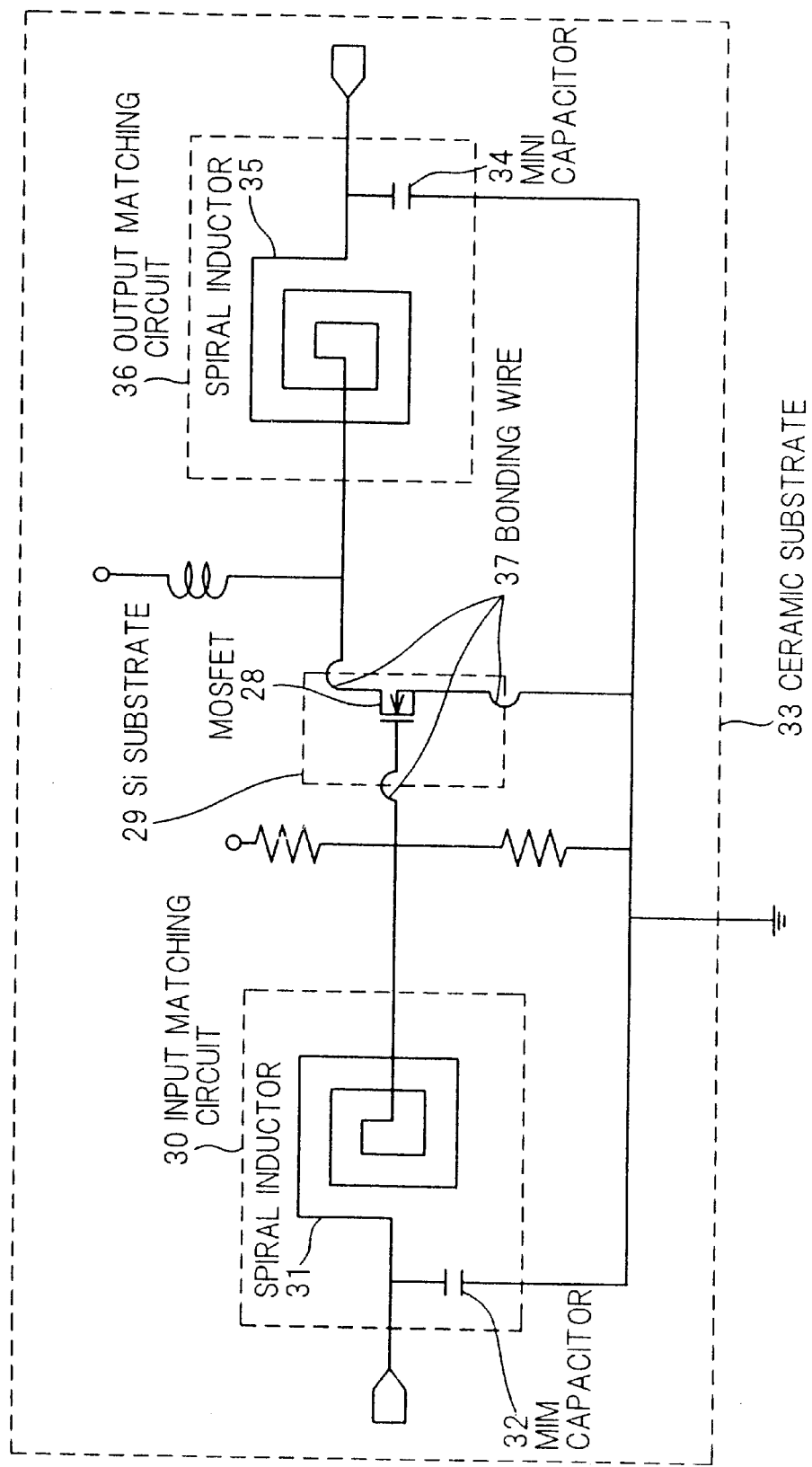
FIG. 6 is a circuit diagram showing a high-frequency amplification device in a second preferred embodiment according to the invention.

FIG. 6 shows a high-frequency amplification device in the second preferred embodiment according to the invention. This embodiment is an example of a 900 MHz-band high-frequency amplification device, in which silicon-MOSFET (MOSFET 28) is used as an amplification element and an input matching circuit 30 and an output matching circuit 36 are formed on a ceramic substrate 33. MOSFET 28 formed on the silicon substrate 29 is fixed on the ceramic substrate 33 and is connected through a bonding wire 37 to a passive circuit on the ceramic substrate 33. MOSFET 28 has a stability factor k of less than 1 for the device itself at 900 MHz band.

The input matching circuit 30 is composed of a spiral inductor 31 and a MIM capacitor 32. The output matching circuit 36 is composed of a spiral inductor 35 and a MIM capacitor 34. The spiral inductors 31, 35 have a size reduced by winding a small-width wire many times and have a large loss. Due to this loss, the amplifier has a gain, which is maximum practically, 3 dB lower than MSG of MOSFET itself. Also, the input/output reflection coefficient is suppressed low.

Figure 7:
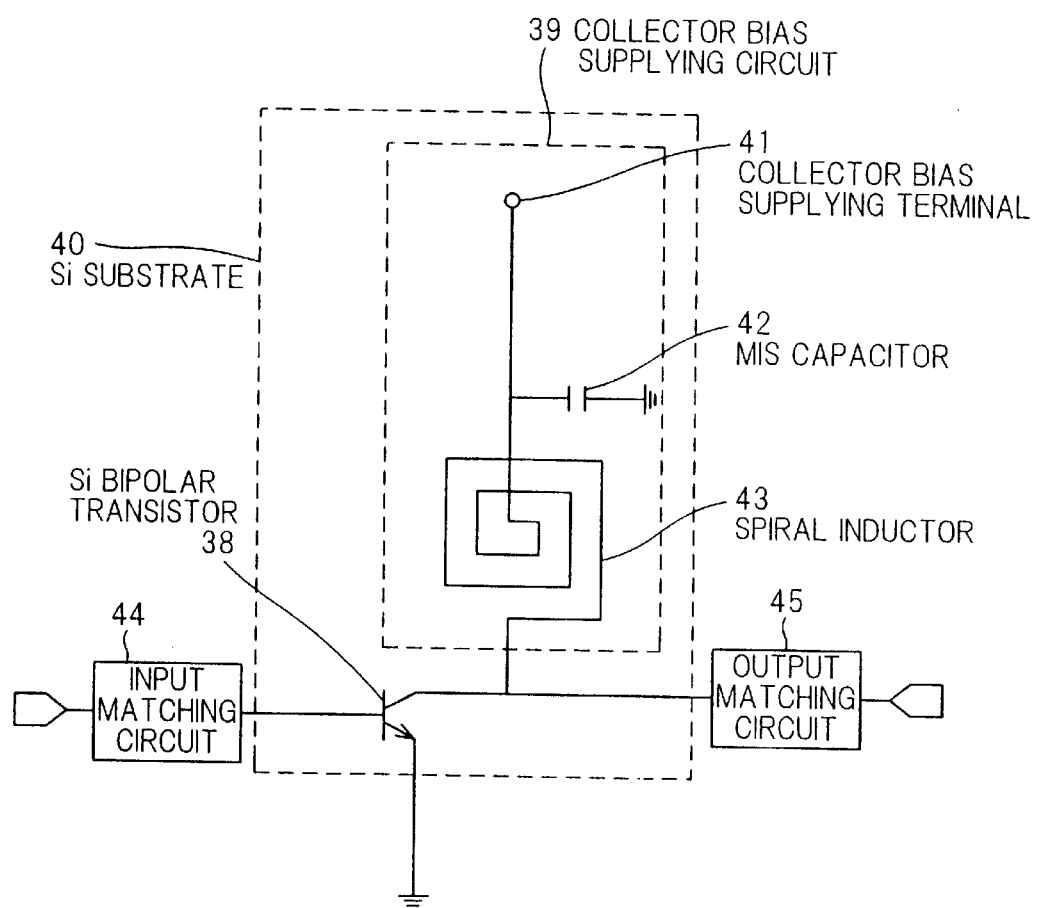
FIG. 7 is a circuit diagram showing a high-frequency amplification device in a third preferred embodiment according to the invention.

FIG. 7 shows a high-frequency amplification device in the third preferred embodiment according to the invention. This embodiment is an example of a 900 MHz-band high-frequency amplification device. In this embodiment, a silicon bipolar transistor 38 is used as an amplification element and a collector bias supplying circuit 39 to generate a necessary loss is provided.

The collector bias supplying circuit 39 is formed on a silicon substrate 40 on which the silicon bipolar transistor 38 is formed. The silicon bipolar transistor 38 has a stability factor k of less than 1 for the device itself at 900 MHz band. The collector bias supplying circuit 39 is composed of a spiral inductor 43 and a MIS capacitor 42. The spiral inductor 43 has a size reduced by using a small-width wire and has a large loss to high frequency. Due to this loss, the amplifier has a gain, which is maximum practically, 3 dB lower than MSG of the silicon bipolar transistor 38 itself. Also, the input/output reflection coefficient is suppressed low.

Figure 8:
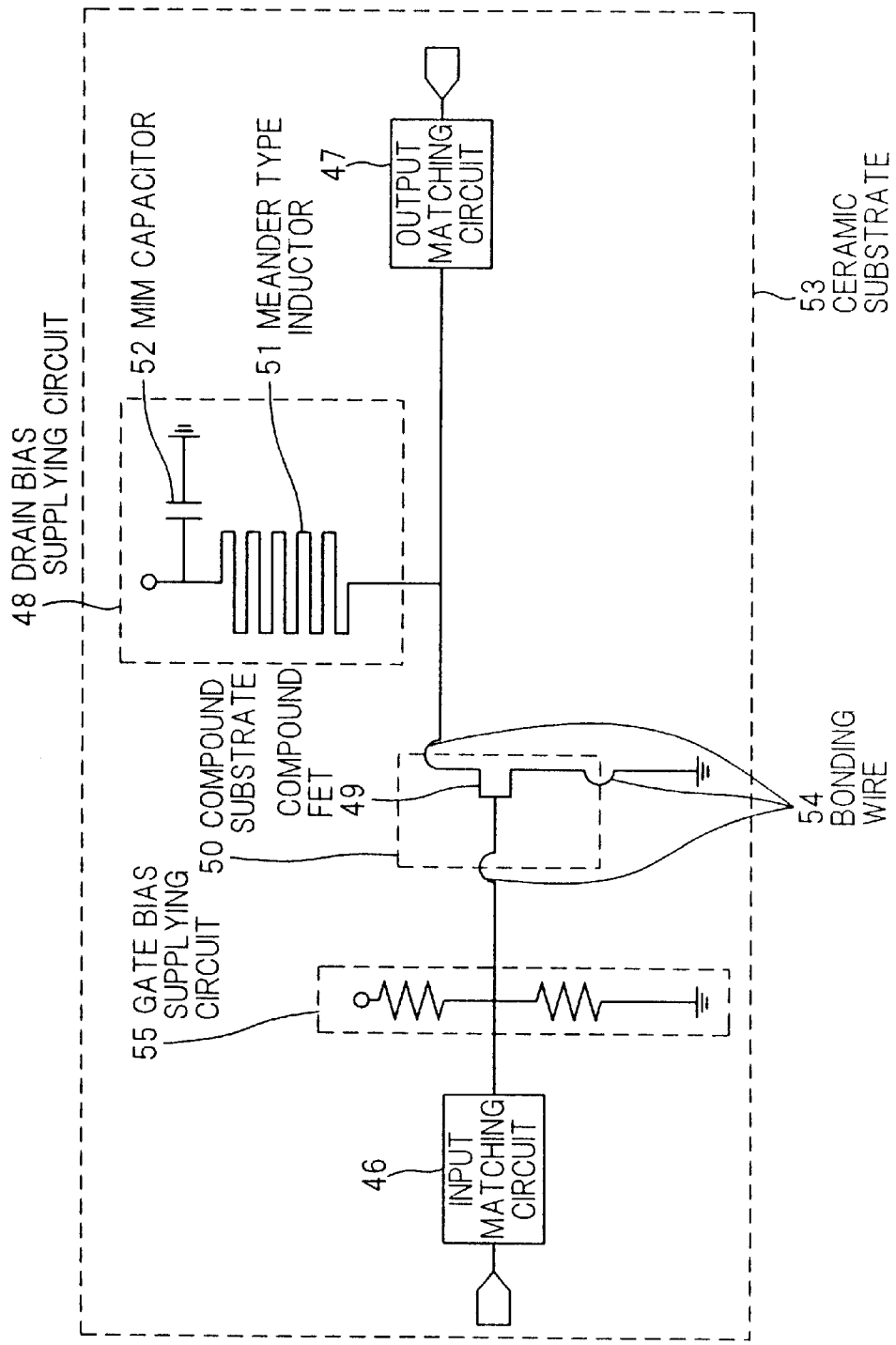
FIG. 8 is a circuit diagram showing a high-frequency amplification device in a fourth preferred embodiment according to the invention.

FIG. 8 shows a high-frequency amplification device in the fourth preferred embodiment according to the invention. This embodiment is an example of a 1.5 GHz-band high-frequency amplification device. In this embodiment, a compound FET 49 is used as an amplification element.

An input matching circuit 46, an output matching circuit 47, a gate bias supplying circuit 55 and a drain bias supplying circuit 48 are formed on a ceramic substrate 53 that is different from a compound substrate 50 on which the compound FET 49 is formed. The compound FET 49 is connected through a bonding wire 54 to a passive circuit on the ceramic substrate 53. The compound FET 49 has a stability factor k of less than 1 for FET itself at 1.5 GHz band.

The drain bias supplying circuit 48 is composed of a meander type inductor 51 and a MIM capacitor 52. The meander type inductor 51 has a size reduced by using a small-width wire and has a large loss to high frequency. Due to this loss, the amplifier has a gain, which is maximum practically, 3 dB lower than MSG of the compound FET 49 itself. Also, the input/output reflection coefficient is suppressed low.

Figure 9:
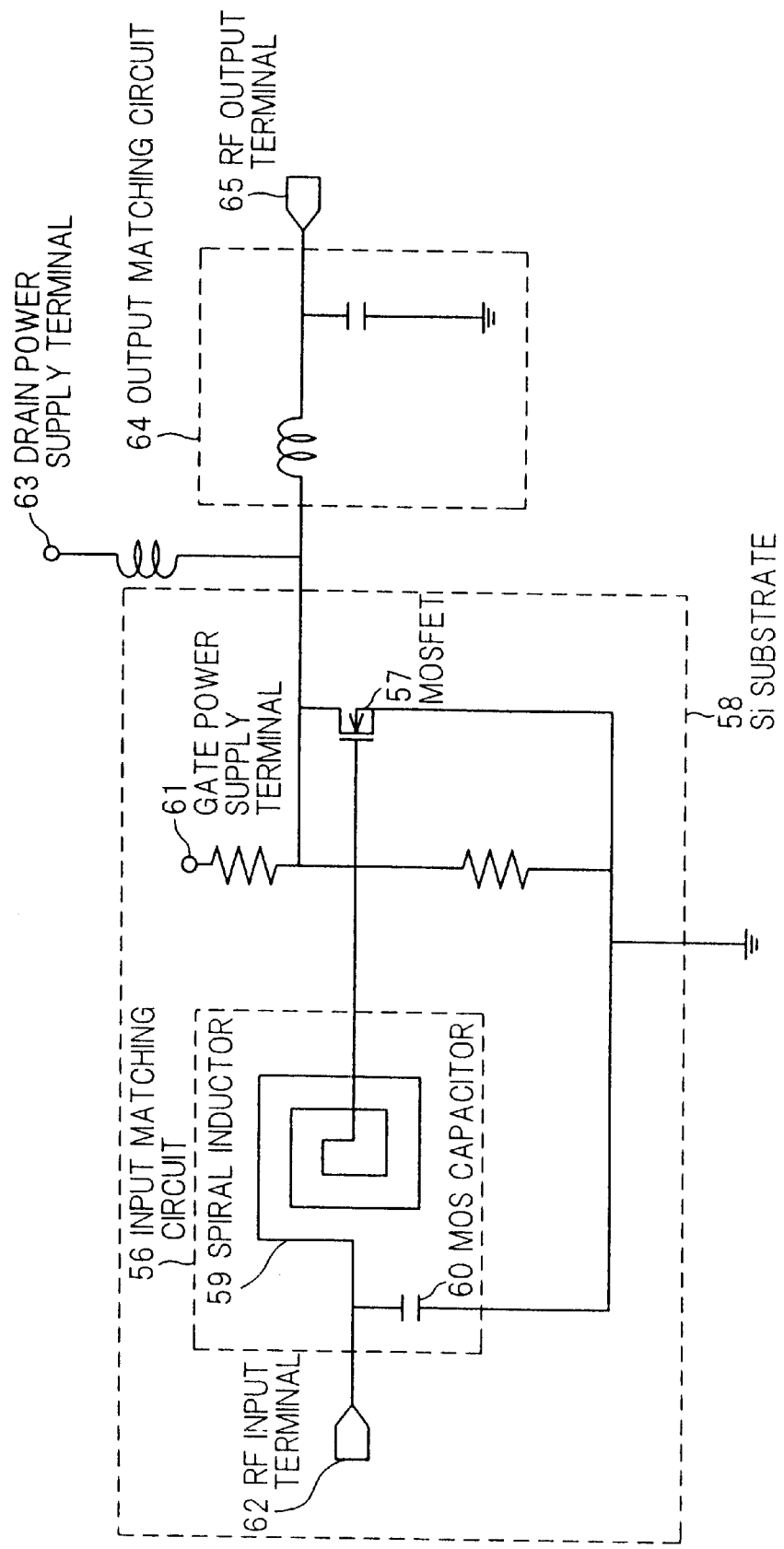
FIG. 9 is a circuit diagram showing a high-frequency amplification device in a fifth preferred embodiment according to the invention.

FIG. 9 shows a high-frequency amplification device in the fifth preferred embodiment according to the invention. This embodiment is an example of a 900 MHz-band high-frequency amplification device. In this embodiment, MOSFET 57 is used as an amplification element.

An input matching circuit 56 is formed on a silicon substrate 58 on which MOSFET 57 is formed. An output matching circuit 64 is formed on a substrate that is different from the silicon substrate 58. MOSFET 57 has a stability factor k of less than 1 for the device itself at 900 MHz band.

The input matching circuit 56 is composed of a spiral inductor 59 and a MIS capacitor 60. The spiral inductor 59 has a size reduced by winding a small-width wire many times and has a large loss. Due to this loss, the amplifier has a gain, which is maximum practically, 3 dB lower than MSG of MOSFET 57 itself. Also, the input/output reflection coefficient is suppressed low.

Figure 10:
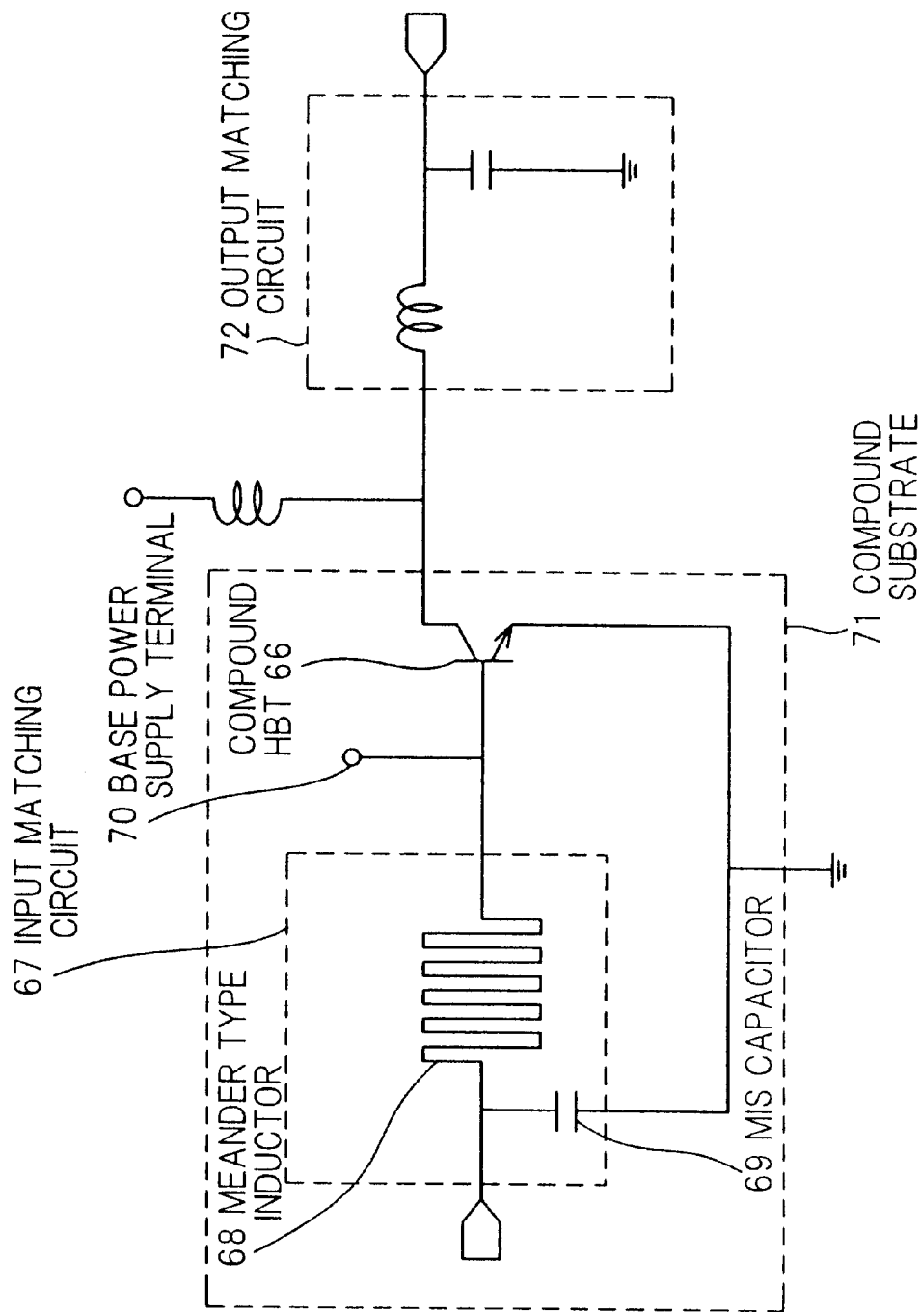
FIG. 10 is a circuit diagram showing a high-frequency amplification device in a sixth preferred embodiment according to the invention.

FIG. 10 shows a high-frequency amplification device in the sixth preferred embodiment according to the invention. This embodiment is an example of a 3.0 GHz-band high-frequency amplification device. In this embodiment, a compound HBT (heterobipolar transistor) 66 is used as an amplification element.

An input matching circuit 67 is formed on a compound substrate 71 on which the compound HBT 66 is formed. An output matching circuit 72 is formed on a substrate that is different from the compound substrate 71. The compound HBT 66 has a stability factor k of less than 1 for the device itself at 3.0 GHz band.

The input matching circuit 67 is composed of a meander type inductor 68 and a MIS capacitor 69. The meander type inductor 68 has a size reduced by using a small-width wire and has a large loss. Due to this loss, the amplifier has a gain, which is maximum practically, 3 dB lower than MSG of the compound HBT 66 itself. Also, the input/output reflection coefficient is suppressed low.

Figure 11:
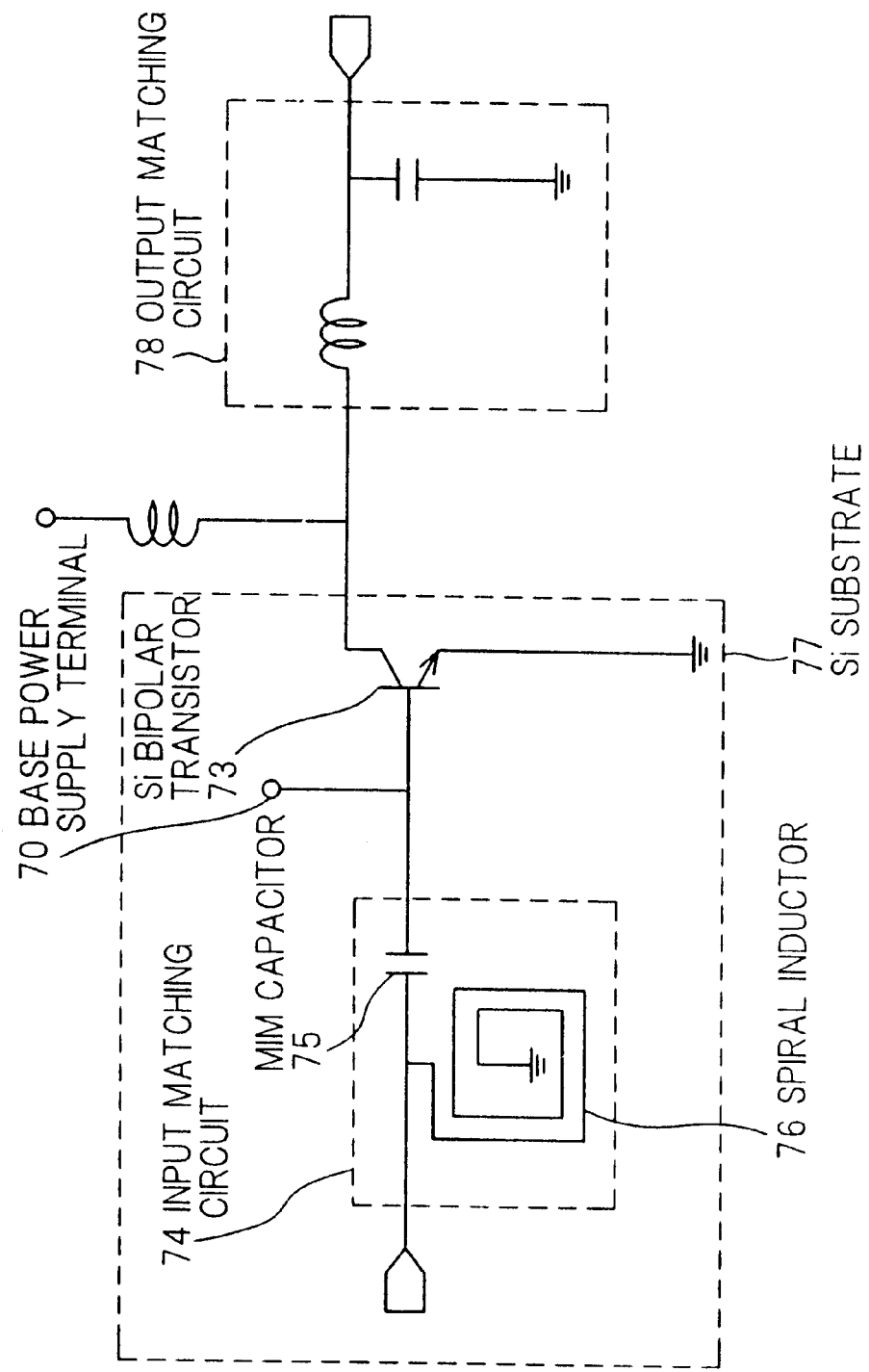
FIG. 11 is a circuit diagram showing a high-frequency amplification device in a seventh preferred embodiment according to the invention.

FIG. 11 shows a high-frequency amplification device in the seventh preferred embodiment according to the invention. This embodiment is an example of a 1.5 GHz-band high-frequency amplification device. In this embodiment, a silicon bipolar transistor 73 is used as an amplification element.

An input matching circuit 74 is formed on a silicon substrate 77 on which the silicon bipolar transistor 73 is formed. An output matching circuit 78 is formed on a substrate that is different from the silicon substrate 77. The silicon bipolar transistor 73 has a stability factor k of less than 1 for the device itself at 1.5 GHz band.

The input matching circuit 74 is composed of a spiral inductor 76 and a MIM capacitor 75. The spiral inductor 76 is grounded at the center of the spiral. The dielectric film between the upper and lower electrodes of the MIM capacitor 75 has a thickness approximately equal to that of dielectric film between the lower electrode and the silicon substrate. Namely, particular high-permittivity film and thin dielectric film for capacitor are not used, thereby the processing cost can be reduced. Since the lower electrode is in capacitive coupling with the silicon substrate, the MIM capacitor 75 has a large loss. Due to this loss, the amplifier has a gain, which is maximum practically, 3 dB lower than MSG of the silicon bipolar transistor 73 itself. Also, the input/output reflection coefficient is suppressed low.

Figure 12:
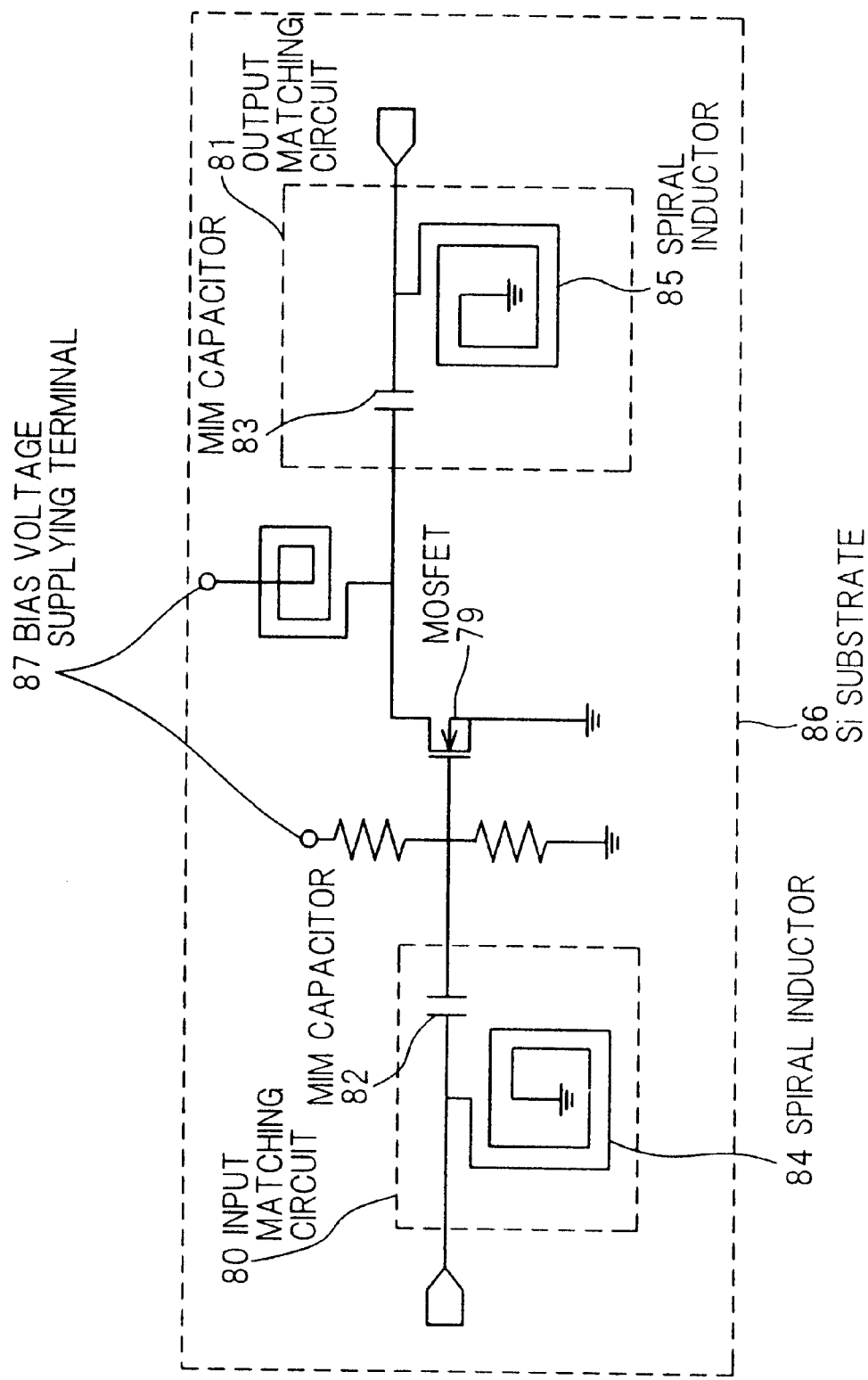
FIG. 12 is a circuit diagram showing a high-frequency amplification device in an eighth preferred embodiment according to the invention.

FIG. 12 shows a high-frequency amplification device in the eighth preferred embodiment according to the invention. This embodiment is an example of a 900 MHz-band high-frequency amplification device. In this embodiment, MOSFET 79 is used as an amplification element.

An input matching circuit 80 and an output matching circuit 81 are formed on a silicon substrate 86 on which MOSFET 79 is formed. MOSFET 79 has a stability factor k of less than 1 for the device itself at 900 MHz band.

The input matching circuit 80 is composed of a spiral inductor 84 and a MIS capacitor 82. The output matching circuit 81 is composed of a spiral inductor 85 and a MIS capacitor 83. The spiral inductors 84, 85 are grounded at the center of the spiral.

The upper electrode of the MIS capacitors 82, 83 is of tungsten silicide (WSi) as well as the gate of MOSFET 79, the lower electrode is of n-type silicon, and capacitive dielectric film is of gate oxide film. The silicon substrate 86 is of p-type, and the lower electrode and the silicon substrate 86 are cut off to direct-current by the p-n junction between the lower electrode and the silicon substrate 86. The MIS capacitors 82, 83 are formed by using the process of making the MOSFET 79, therefore a wasteful process for making the capacitor is not conducted. Also, by using the gate oxide film as the capacitive dielectric film, the capacitor can be miniaturized without conducting particular high-permittivity dielectric film or dielectric thin film.

The MIS capacitors 82, 83 have a large loss since they use n-type silicon with a high resistivity for the lower electrode. Due to this loss, the amplifier has a gain, which is maximum practically, 3 dB lower than MSG of the MOSFET 79 itself. Also, the input/output reflection coefficient is suppressed low.

Figure 13:
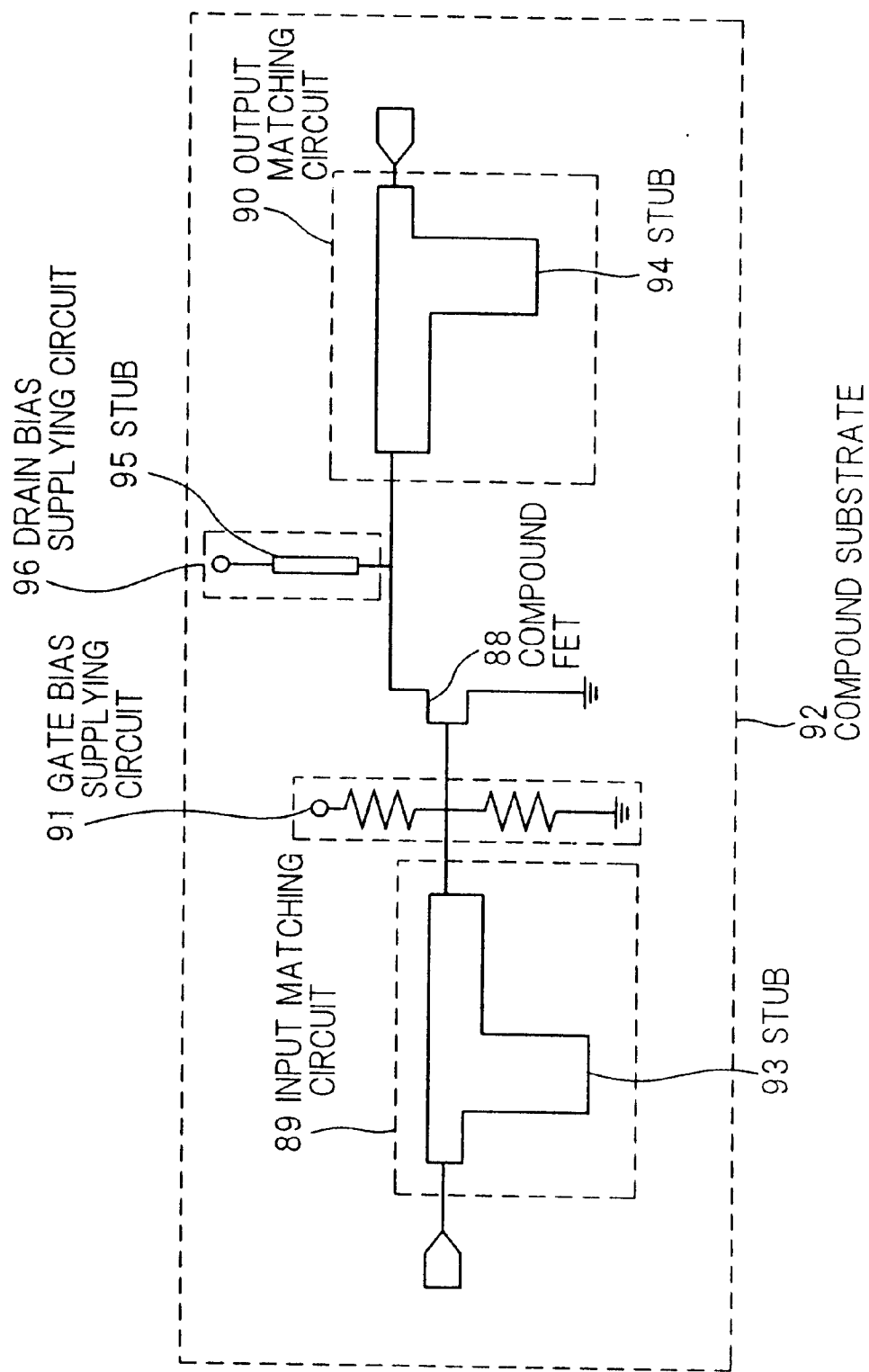
FIG. 13 is a circuit diagram showing a high-frequency amplification device in a ninth preferred embodiment according to the invention.

FIG. 13 shows a high-frequency amplification device in the ninth preferred embodiment according to the invention. This embodiment is an example of a 1.9 GHz-band high-frequency amplification device. In this embodiment, a compound FET 88 is used as an amplification element.

An input matching circuit 89, an output matching circuit 90, a gate bias supplying circuit 91 and a drain bias supplying circuit 96 are formed on a compound substrate 92 on which the compound FET 88 is formed. The compound FET 88 has a stability factor k of less than 1 for FET itself at 1.9 GHz band. The input matching circuit 89 is composed of a stub 93 and the output matching circuit 90 is composed of a stub 94. The drain bias supplying circuit 96 is composed of a stub 95.

The stubs 93, 94 and 95 are formed using a small-width wire, thereby the area of the matching circuit and bias supplying circuit can be reduced. Since the stubs 93, 94 and 95 have a small wire width, the matching circuits 89, 90 and the drain bias supplying circuit 96 have a large loss. Due to this loss, the amplifier has a gain, which is maximum practically, 3 dB lower than MSG of the compound FET 88 itself. Also, the input/output reflection coefficient is suppressed low.

It will be appreciated that, in the above embodiments, the matching circuit and bias circuit that are elements to generate a loss in the amplification circuit, and their combination, the kind of amplification element used, the composition of inductor, capacitor and stub to compose the matching circuit, and whether these components are formed on the same substrate as the amplification element may be modified and the modifications compose other embodiments according to the invention.

Advantages of the Invention

In the high-frequency amplification device of the invention, the active element that has a sufficiently reduced resistance component of input impedance so as to have a stability factor k of less than 1 for the active element itself at a working frequency band is used. Also, using any of the loss of the matching circuit, the loss of the bias supplying circuit, and the loss of the matching circuit and bias supplying circuit, the stability factor k of the amplification device is made to be greater than 1. Therefore, an instable operation such as oscillation can be prevented.

In this invention, the matching circuit and bias supplying circuit can be miniaturized and the high-frequency amplification device can conduct a stable amplification operation.

Furthermore, in this invention, the increase in manufacturing cost of device can be avoided because of not using thick wiring metal and large-width wiring in making the matching circuit and bias supplying circuit, and not using high-permittivity film and dielectric thin film for capacitor. In addition, the reduction in performance due to the loss of the matching circuit and bias supplying circuit can be prevented. Thereby, the performance of device can be utilized maximumly.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A high-frequency amplification device, comprising:
    an active element; and
    a matching circuit for said active element;
    wherein said active element has such a small resistance component of input impedance that gives a stability factor k of less than 1 for the active element itself at a frequency band that said high-frequency amplification device is used, and a loss of said matching circuit is used to give a stability factor k of greater than 1 for said high-frequency amplification device.

2. A high-frequency amplification device, according to claim 1, wherein:
    said matching circuit is formed on the same substrate that said active element is formed.

3. A high-frequency amplification device, according to claim 1, wherein:
    said matching circuit includes any one element of a spiral inductor, a meander type inductor, a MIM (metal insulator metal) capacitor, a MIS (metal insulator semiconductor) capacitor and a stub, and a loss of said element is used to give a stability factor k of greater than 1 for said high-frequency amplification device.

4. A high-frequency amplification device, according to claim 2, wherein:
    said matching circuit includes any one element of a spiral inductor, a meander type inductor, a MIM (metal insulator metal) capacitor, a MIS (metal insulator semiconductor) capacitor and a stub, and a loss of said element is used to give a stability factor k of greater than 1 for said high-frequency amplification device.

5. A high-frequency amplification device, comprising:
    an active element; and
    a bias supplying circuit for said active element;
    wherein said active element has such a small resistance component of input impedance that gives a stability factor k of less than 1 for the active element itself at a frequency band that said high-frequency amplification device is used, and a loss of said bias supplying circuit is used to give a stability factor k of greater than 1 for said high-frequency amplification device.

6. A high-frequency amplification device, according to claim 5, wherein:
    said bias supplying circuit is formed on the same substrate that said active element is formed.

7. A high-frequency amplification device, comprising:
    an active element; and
    a matching circuit and a bias supplying circuit for said active element;
    wherein said active element has such a small resistance component of input impedance that gives a stability factor k of less than 1 for the active element itself at a frequency band that said high-frequency amplification device is used, and a loss of said matching circuit and said bias supplying circuit is used to give a stability factor k of greater than 1 for said high-frequency amplification device.

8. A high-frequency amplification device, according to claim 1, wherein:
    said active element is any one of a silicon MOSFET, a silicon bipolar transistor, a compound FET and a compound HBT (heterobipolar transistor).

9. A high-frequency amplification device, according to claim 2, wherein:
    said active element is any one of a silicon MOSFET, a silicon bipolar transistor, a compound FET and a compound HBT.

10. A high-frequency amplification device, according to claim 3, wherein:
    said active element is any one of a silicon MOSFET, a silicon bipolar transistor, a compound FET and a compound HBT.

11. A high-frequency amplification device, according to claim 4, wherein:
    said active element is any one of a silicon MOSFET, a silicon bipolar transistor, a compound FET and a compound HBT.

12. A high-frequency amplification device, according to claim 5, wherein:
    said active element is any one of a silicon MOSFET, a silicon bipolar transistor, a compound FET and a compound HBT.

13. A high-frequency amplification device, according to claim 6, wherein:
    said active element is any one of a silicon MOSFET, a silicon bipolar transistor, a compound FET and a compound HBT.

14. A high-frequency amplification device, according to claim 7, wherein:
    said active element is any one of a silicon MOSFET, a silicon bipolar transistor, a compound FET and a compound HBT.

* * * * *